United States Patent
Lauronen et al.

(10) Patent No.: US 10,973,032 B2
(45) Date of Patent: Apr. 6, 2021

(54) PORTABLE MEASURING DEVICE

(71) Applicant: Ekahau Oy, Helsinki (FI)

(72) Inventors: Mikko Lauronen, Helsinki (FI);
Jussi-Heikki Matias Kiviniemi, Espoo (FI)

(73) Assignee: Ekahau Oy, Helsinki (FI)

( * ) Notice: Subject to any disclaimer, the term of this patent is extended or adjusted under 35 U.S.C. 154(b) by 248 days.

(21) Appl. No.: 16/122,142

(22) Filed: Sep. 5, 2018

(65) Prior Publication Data

US 2019/0075567 A1 Mar. 7, 2019

(30) Foreign Application Priority Data

Sep. 7, 2017 (FI) .................................. U20174208

(51) Int. Cl.
| | |
|---|---|
| *H04W 72/08* | (2009.01) |
| *H04B 1/10* | (2006.01) |
| *G01R 23/18* | (2006.01) |
| *H01Q 1/22* | (2006.01) |
| *H04B 1/00* | (2006.01) |
| *G01R 23/04* | (2006.01) |

(52) U.S. Cl.
CPC .......... *H04W 72/082* (2013.01); *G01R 23/18* (2013.01); *H01Q 1/22* (2013.01); *H04B 1/0064* (2013.01); *H04B 1/1027* (2013.01); *G01R 23/04* (2013.01)

(58) Field of Classification Search
CPC .................. H04B 17/15; H04B 7/0413; H04N 21/41407; H04N 21/482; G01R 29/10
See application file for complete search history.

(56) References Cited

U.S. PATENT DOCUMENTS

| | | | |
|---|---|---|---|
| 9,080,438 B1 * | 7/2015 | McCoy ................. | E21B 47/009 |
| 9,836,101 B1 * | 12/2017 | Saravis .................. | G06F 1/206 |
| 2007/0291825 A1 * | 12/2007 | Endoh ..................... | G01S 19/36 |
| | | | 375/147 |
| 2015/0296185 A1 * | 10/2015 | Kirschner .............. | G01C 17/02 |
| | | | 348/116 |

* cited by examiner

*Primary Examiner* — Elias Desta
(74) *Attorney, Agent, or Firm* — Vos-IP, LLC

(57) ABSTRACT

To facilitate disturbance measurements within a WLAN network, a portable measuring device is introduced. The portable measuring device comprises at least a casing, one or more interfaces to detachably connect an external device to the portable measuring device, a processor placed in the casing, one or more antennas, two simultaneously operating radios placed in the casing, one or more power sources placed in the casing, and a power switch.

9 Claims, 2 Drawing Sheets

PORTABLE MEASURING DEVICE

RELATED APPLICATIONS

This application claims priority to Finnish utility model no. 11861, filed on Sep. 7, 2017, the contents of which is hereby incorporated herein by reference in its entirety.

FIELD

The invention relates to a portable measuring device that measures radio properties of wireless local area networks.

BACKGROUND

Wireless local area networks, WLAN networks, using unlicensed radio frequencies for data transfer, have become more and more common both at home and in public premises. Companies often have a WLAN network on their business premises, to which WLAN devices of employees, including smart phones, laptop computers, and tablets, as for example, may connect. For visitors' devices, the business premises may have a separate WLAN network. Restaurants, cafes, hotels, and airports, for example, provide a WLAN network for their customers to use. In addition, municipalities have set up open WLAN networks that may cover the built-up areas, libraries, and/or schools of the municipality. In addition to WLAN devices, other devices, too, make use of license-free radio frequencies in wireless data transfer. Devices operating on the same radio frequency band disturb each other. There may further be other interfering factors, such as a microwave oven.

When WLAN networks are designed and maintained, one should take into account the various sources of disturbance in the WLAN network area. For this purpose, systems have been developed in which one or more separate measuring devices are connected to a laptop computer or tablet, each with their own USB interface either directly or through a USB hub to the computer or tablet, and the entire system is moved within the WLAN network area to carry out measurements. In particular when a plurality of WLAN frequencies are simultaneously measured, the system is clumsy and may even itself cause errors in measurement results.

SUMMARY

The invention relates to a portable device which is characterized by what is stated in the independent claim. The preferred embodiments are disclosed in the dependent claims.

An aspect introduces a portable measuring device which may be used regardless of whether it is connected to another device.

BRIEF DESCRIPTION OF THE DRAWINGS

In the following different embodiments of the invention will be described in greater detail with reference to the attached drawings, in which.

DETAILED DESCRIPTION OF SOME EMBODIMENTS

The following embodiments are exemplary. Although the specification may refer to "an", "one", or "some" embodiment(s) in several locations, this does not necessarily mean that each such reference is to the same embodiment(s)/example(s), or that the feature only applies to a single embodiment/example. Single features of different embodiments/examples may also be combined to provide other embodiments.

Figure 1:
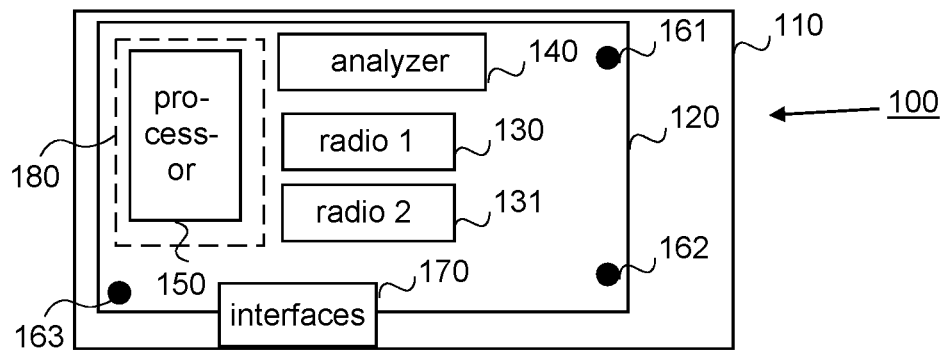
FIGS. 1 and 2 show a schematic cross section of a portable measuring device.

FIG. 1 is a schematic view of a portable measuring device 100 according to an implementation. The structure shown in FIG. 1 is modular, but the structure may also be implemented as an integrated structure.

With reference to FIG. 1, the portable measuring device 100 of the example in FIG. 1 comprises a casing 110 which houses a printed circuit board 120 and the components installed on it. In the example of FIG. 1, the components comprise at least two radios 130, 131, a spectrum analyzer 140, a processor 150, and a power source 180. In another example, the components comprise at least two radios 130, 131, a processor 150, and a power source 180, but not the spectrum analyzer 140. In yet another example, the components comprise a power source 180 and one or more spectrum analyzers 140, and possibly, but not necessarily, a processor 150. In the portable measuring device of FIG. 1, there are also antennas 161, 162, 163 connected to the edges of the circuit board. The portable measuring device further comprises one or more interfaces 170 to communicate from the measuring device 100 information gathered by the measuring device and to update the settings of the measuring device 100, for example.

The casing 110 may be of any material and may comprise one or more parts. An example of the casing will be described below in connection with FIGS. 3A to 3E.

The circuit board 120 may be any circuit board which connects the components, which in the example of FIG. 1 include the radios 130, 131, spectrum analyzer 140, power source 180, and interfaces 170, to each other without separate wires through connection cards, for example, and at the same time acts as their mounting base. The circuit board may be replaced by another mounting base, and/or the components (spectrum analyzer, radios, power source, interfaces) or part of them may be directly fastened to the casing and the components connected with required wires.

The radios 130, 131 may be receivers, only, or transceivers, or one of them may be a receiver and other one a transceiver. The radios 130, 131 may be any off-the-shelf radio cards, configured (adapted) to operate on the frequencies being examined or on part of the frequencies. Naturally, tailored radios may also be used. The radios 130, 131 are arranged to operate simultaneously and advantageously on different frequency bands. This is beneficial in that adequate information on a plurality of frequency bands is obtained within a shorter measuring period, in particular when information is being collected on a plurality of frequency bands, than a measuring period needed when using one radio. In an embodiment, both radios 130, 131 are enterprise grade two-frequency radios of the WLAN standard 802.11ac, which operate on both the 2.4 GHz and 5 GHz frequency bands. Radios according to the WLAN standard 802.11ac are compatible with radios of the WLAN standards 802.11n, 802.11g, 802.11b and 802.11a, so they may be used to measure information in networks of the corresponding standards. In other embodiments, the radios may be according to another standard, such as radios according to any of the WLAN standards referred to in the above. In addition, both radios or one of them may be a single-frequency radio. It should be understood that there may be more radios than two, and that the radios may be radios according to different standards. The measuring device may, for example, have two WLAN radios and one Bluetooth radio.

The spectrum analyzer 140 is configured to gather information on radio frequency distribution to detect disturbance (interference) on the radio frequency. When examining a WLAN network, the spectrum analyzer 140 is configured to listen to WLAN traffic on the WLAN frequency band/bands to detect active base stations and to measure signal strengths, noise levels, and mutual disturbance of channel signals. Disturbance may be caused by non-WLAN standard devices operating on the same radio frequency or affecting the radio frequency, such as wireless phones, Bluetooth devices, Zig Bee devices, microwave ovens, etc. In an embodiment, the spectrum analyzer is a very fast, high-resolution spectrum analyzer, comprising a wideband receiver and configured to process information extremely fast so that it may perform up to 25 sweeps per second on both the 2.4 GHz and 5 GHz frequency bands. In other words, the spectrum analyzer is more than ten times faster, and due to the speed, more than ten times more accurate than prior art spectrum analyzers. As a result, the time used for the actual measurements is decreased. In another embodiment, a spectrum analyzer on the market may be used, or a plurality of spectrum analyzers which is, or are, configured or configurable to measure the radio frequency spectrum on one or more frequency bands, such as 2.4 GHz and 5 GHz frequency bands. Due to the dedicated power source on the portable measuring device, the operation of the spectrum analyzer need not be limited, as is the case with a slower current supply via an USB bus.

Figure 4:
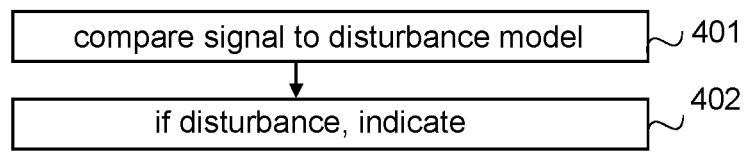
FIG. 4 shows an example of use of a measuring device in the form of a flowchart.

The processor 150 may be any processor on the market. Through the processor, the settings of the measuring device are set, including calibration, and they may be changed. This way, the measuring device may be calibrated with precision and the calibration updated as part of, for example, the updating of the measuring device. Consequently, the measurements are most precise and standardized. The processor 150 includes memory and also enables that in some embodiments the measurements are carried out exclusively with the portable measuring device and later processed on a computer, or to be more exact, an analyzing program installed on the computer. By means of the processor, the portable measuring device may also be configured (set), if so desired, to process the measuring results, so to analyze the radio environment. An example of the configuration is shown by FIG. 4.

In the embodiment of FIG. 1, the portable measuring device 100 also comprises antennas 161, 162, 163 installed at the edges of the circuit board 120. By using a plurality of antennas 161, 162, 163 and placing them substantially evenly at the edges of the circuit board in different positions and polarizations, the accuracy of the portable measuring device 100 is improved. The portable measuring device may have, for example, seven antennas out of which three are connected to one radio, three to a second radio, and one to a spectrum analyzer.

The power source 180 may be a fixed battery or a detachably fixed battery. The battery 180 may be a rechargeable battery, such as a lithium ion battery. Naturally, other power sources, too, may be used, including single-use batteries.

The measuring device shown in FIG. 1, when WLAN radios are used and the spectrum analyzer is configured for the WLAN frequencies, is a portable measuring device with which it is possible to measure simultaneously WLAN signals on at least two frequencies/channels and the radio frequency spectrum on all the WLAN frequency bands.

Figure 2:
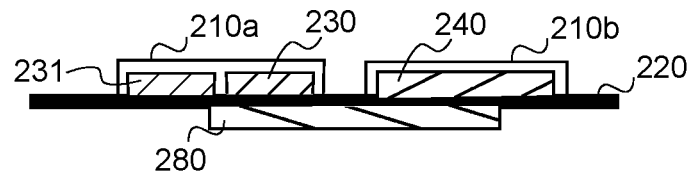

FIG. 2 shows a cross section according to an embodiment of the inside of the casing of the portable measuring device. In the embodiment of the Figure, the radios 230, 231 installed on the circuit board 220 are covered by a shield 210*a*, and the spectrum analyzer 240 is covered by a shield 210*b*, whereas the battery 280 is uncovered. By covering the radios 230, 231 and spectrum analyzer 240 with separate shields 210*a*, 210*b*, the disturbance caused by the radios and spectrum analyzer themselves is minimized and the measuring results are thus improved. The shield may be a box-like cover made of sheet metal and open at the bottom. Other materials preventing the radio waves from propagating may be used.

FIGS. 3A to 3E are side views of a casing according to an embodiment of the portable measuring device.

Figure 3A:
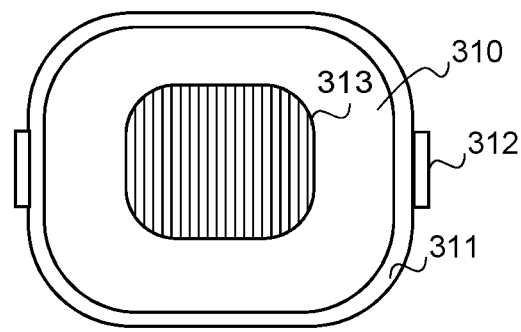
FIGS. 3A to 3E are schematic side views of a portable measuring device.

FIG. 3A is a side view of the casing 310 from the direction, which is on the side of the portable measuring device illustrated in FIGS. 1 and 2, where the spectrum analyzer and radios are on the circuit board. In the example of FIG. 3A, a band 311 surrounds the casing. On both sides of the casing 310 there are clamps 312 to which a USB cable may be threaded in measuring situation, for example, by means of which a laptop computer, a tablet computer or an external display is connected to the portable measuring device in order to display in real time the analysis results of the measured information, for example. The band 311 and clamps 312 may be of a flexible, rubber-like material, such as thermoplastic elastomer. The flexible band makes the measuring device more robust, because it dampens potential impacts the measuring device may be subjected to.

In the example of FIG. 3A, the casing comprises a cooling element 313 by means of which overheating of the components of the portable measuring device is prevented. The cooling element 313 is advantageously of a material that conducts heat well, such as profiled aluminum. The casing may naturally also comprise two or more cooling elements.

Figure 3B:
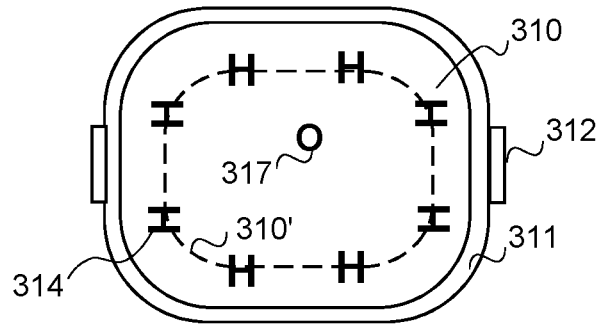

FIG. 3B shows the casing 310 from the opposite direction to FIG. 3A. The casing 310 according to the embodiment shown has at its mountings (mounts, mounting means, inserts, embedded fixtures, supports, etc.) eight H-shaped recesses 314 to fasten a carrying strap or straps to the portable measuring device at a place where the measurer wants them. In the example of FIG. 3B, the casing 310 also comprises a detachable lid part 310' to replace the battery with a new one, for example.

In the example of FIG. 3B, the casing 310 also has one or more mountings 317 (mounts, mounting means, inserts, embedded fixtures, supports, etc.) to fasten the portable measuring device to a stand, for example. The mounting 317 may be, for example, a mounting commonly found on SLR cameras.

Figure 3C:
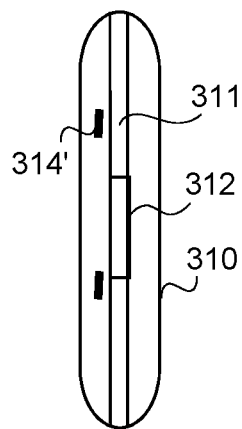

FIG. 3C is a side view of the casing 310, on the side that has a clamp 312. The casing 310 according to the embodiment shown also has, as its mountings (mounts, mounting means, inserts, embedded fixtures, supports, etc.), two through-holes 314', both to the corresponding H-shaped recess to fasten a carrying strap or similar. The H-shaped recesses and through-holes allow most diverse settings of the carrying strap or straps and methods of carrying: the measuring device may be carried as if it were a backpack, shoulder-bag, handbag, or bum bag.

Figure 3D:
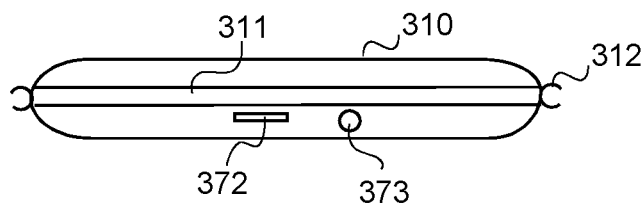
Figure 3E:
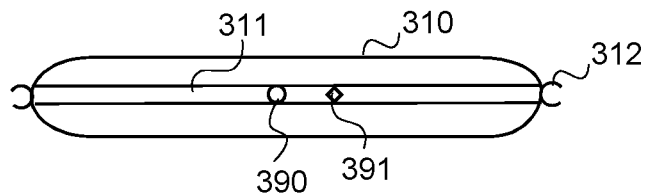

FIGS. 3D and 3E are side views of the casing 310 from the sides that do not have a clamp 312. In the presented embodiment, one of these sides, the one shown in FIG. 3D, has one or more interfaces 372 for data transfer and one interface 373 for the power source, for example to the power supply for the purpose of recharging the battery. The communications interface 372 may be a USB interface, mini-USB interface, or micro-USB interface. Correspondingly, in the second of these sides, the one shown in FIG. 3E, there is a power switch 390 by means of which the various components, such as the radios and spectrum analyzer, if any, are simultaneously switched on and off. The example set forth also has one LED light 391. It should be understood that there may also be a plurality of LED lights and there may be LED lights also on different sides, or no LED lights.

In the above, merely examples are put forth of what the portable measuring device may comprise. The portable measuring device need not comprise all of the components described above. For example, the flexible band and/or straps are not necessarily needed. Some of the components or means may be replaced by corresponding components/means. For example, the recesses 314 and through-holes 314' may be replaced by another type of fasteners for a carrying strap, if the portable measuring device is equipped with a fastener for a carrying strap. The cooling element of the casing may be replaced by a fan, for example, or the portable measuring device may have both a fan and one or more cooling elements in the casing. The portable measuring device may also comprise other components than those referred to above, such as a reset switch and/or positioning equipment (positioning means), such as a GPS device.

As set forth in the above, the portable measuring device may be configured to analyze the measurement results so that there is necessarily no need to analyze them with a separate computer.

FIG. 4 shows an example of what the portable measuring device may be configured to do when power is switched on and the battery is not empty.

With reference to FIG. 4, the portable measuring device is configured to compare (step 401) a received signal to a disturbance model, and if the comparison reveals a disturbance or disturbance factor, to indicate (step 402) the disturbance factor and/or disturbance. The indication may take place by blinking of an LED light, for example. If an external display is connected to the portable measuring device, the indication options are more diverse.

The method of FIG. 4, and other corresponding configurations, may also be carried out in the form of a computer process defined by a computer program or portions thereof, for example by executing at least one portion of a computer program comprising corresponding instructions.

The computer program may be in source code form, object code form, or in some intermediate form, and it may be stored in some sort of carrier, which may be any entity or device capable of carrying the program. For example, the computer program may be stored on a computer program distribution medium readable by a computer or a processor. The computer program medium may be, for example but not limited to, a record medium, computer memory, read-only memory, electrical carrier signal, telecommunications signal, and software distribution package, for example. The computer program medium may be a non-transitory medium. Coding of software for carrying out the embodiments as shown and described is well within the scope of a per-son of ordinary skill in the art.

Even though the invention has been described above with reference to examples according to the accompanying drawings, it is clear that the invention is not restricted thereto but can be modified in several ways within the scope of the appended claims. Therefore, all words and expressions should be interpreted broadly and they are intended to illustrate, not to restrict, the embodiment. It will be obvious to a person skilled in the art that, as technology advances, the inventive concept can be implemented in various ways. Further, it is clear to a person skilled in the art that the described embodiments may, but are not required to, be combined with other embodiments in various ways.

What is claimed is:

1. A portable measuring device which comprises at least:
a casing,
one or more interfaces to detachably connect an external device to the portable measuring device,
a processor placed in the casing,
one or more antennas,
two simultaneously operating radios placed in the casing,
one or more power sources placed in the casing,
a spectrum analyzer in the casing, and
a power switch.

2. The portable measuring device of claim 1, further comprising a shield installable in the casing around the radios, and a shield installable around the spectrum analyzer.

3. The portable measuring device of claim 1, where the radios are two-band WLAN transmitters.

4. The portable measuring device of claim 1, where the radios are enterprise grade 802.11 ac radios.

5. The portable measuring device of claim 1, configured to compare a received signal to a disturbance model, and to indicate at least one of disturbance and a disturbance factor detected.

6. The portable measuring device of claim 1, in which the power source is a rechargeable battery and the portable measuring device further comprises a power supply interface to charge the battery.

7. The portable measuring device of claim 1, further comprising at least one cooling element.

8. The portable measuring device of claim 7, where the cooling element forms part of the casing and is of a material conducting heat well.

9. The portable measuring device of claim 1, further comprising one or more mountings to detachably mount one or more carrying straps to the portable measuring device.

* * * * *